(12) United States Patent
Inoue et al.

(10) Patent No.: US 6,693,466 B2
(45) Date of Patent: Feb. 17, 2004

(54) COMPARATOR CIRCUIT AND INFRARED SIGNAL RECEIVING APPARATUS

(75) Inventors: Takahiro Inoue, Nara (JP); Naruichi Yokogawa, Kashihara (JP); Takeshi Nishino, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/293,563

(22) Filed: Nov. 14, 2002

(65) Prior Publication Data

US 2003/0112037 A1 Jun. 19, 2003

(30) Foreign Application Priority Data

Nov. 14, 2001 (JP) ...................... P2001-348675

(51) Int. Cl.[7] .................... H03K 5/153; H03K 5/22
(52) U.S. Cl. ........................... 327/72; 327/77
(58) Field of Search .................... 327/72, 73, 77, 327/78, 79, 80, 81, 88, 89, 205, 206, 309, 315, 316, 321, 322

(56) References Cited

U.S. PATENT DOCUMENTS 5,206,542 A  *  4/1993  Nakao ..................... 327/78

FOREIGN PATENT DOCUMENTS

JP        10-187862 A      7/1998

* cited by examiner

*Primary Examiner*—Tuan T. Lam
(74) *Attorney, Agent, or Firm*—Birch, Stewart, Kolasch & Birch, LLP

(57) ABSTRACT

The present invention has an object to control easily the pulse width of an output by operating a limiting circuit appropriately even if the power voltage is low. A limiting circuit is provided on the input side of a hysteresis comparator circuit to prevent saturation. A limit voltage Vlimit is set by a bias circuit so as to change in accordance with the operation of the hysteresis comparator circuit. When an input voltage Vsig exceeds a hysteresis threshold voltage Vth, the limit voltage Vlimit is dropped in response to a drop of the hysteresis threshold voltage Vth. Thus, the width of the pulse width can be controlled while maintaining the condition that the limit voltage Vlimit is higher than the hysteresis threshold voltage Vth.

8 Claims, 9 Drawing Sheets

COMPARATOR CIRCUIT AND INFRARED SIGNAL RECEIVING APPARATUS

This nonprovisional application claims priority under 35 U.S.C. § 119(a) on Patent Application No. 2001-348675 filed in Japan on Nov. 14, 2001, which is herein incorporated by reference.

BACKGROUND OF THE INVENTION

1. Field of the Invention

The present invention relates to a comparator circuit for discriminating input voltages and giving out a logic output indicating the discrimination results, and an infrared signal receiving apparatus that can be realized with such a comparator circuit.

2. Description of the Related Art

Conventionally, a comparator circuit 1 as shown in FIG. 8 has been used, for example, to discriminate integrated output voltages with a receiver of an infrared remote control apparatus or to discriminate outputs of a highly sensitive sensor or the like. The comparator circuit 1 employs a hysteresis comparator circuit 2 that has the hysteresis characteristics at the discrimination level. The hysteresis comparator circuit 2 compares an input voltage with the discrimination level, and when the input voltage becomes higher than the discrimination level, an output Vout is turned on. At the same time, the discrimination level is dropped so as to prevent the output Vout from being turned off, even if the input voltage is slightly varied and dropped. When the input voltage is further dropped to be lower than the dropped discrimination level, the output Vout of the hysteresis comparator circuit 2 is turned off, and the discrimination level is increased. Thus, the hysteresis threshold voltage Vth, which is the discrimination level of the hysteresis comparator circuit 2, is changed with the operational state.

Since in the hysteresis comparator circuit 2, the discrimination level has the hysteresis characteristics, malfunction that might occur inherently in circuits can be prevented, such as chattering in which an output is fluctuated between ON and OFF because the input voltage is fluctuated in the vicinity of the discrimination level when the discrimination level is fixed. In an infrared remote control receiver, for example, a photodiode which is an infrared receiving device receives an infrared signal that is modulated in an ASK (Amplitude Shift Keying) system, and a carrier frequency component is retrieved and detected, the hysteresis comparator circuit 2 determines whether or not a carrier is present while the detected output is integrated in an integrating circuit, and a digital output indicating determination results is given out. The determination results as to whether or not a carrier is present are processed in a logic circuit and thus are converted to digital signals. Since the input voltage for determining the presence of a carrier is an output from the integrating circuit, small fluctuations can readily occur because noise or the like superimposes, although a change is comparatively slow. It is possible to determine the presence of a carrier stably by using the hysteresis comparator circuit 2.

Conventionally, for power voltage for infrared remote control receiver, highly sensitive sensor circuits and the like, 5 V, which is a general power voltage for digital circuits, has been mainly used. In recent years, low power consumption and use of low voltage have been promoted for large-scale semiconductor integrated circuits (LSIs), so that there is a strong demand for use of a low power voltage of 3 V or less for infrared remote control receivers or highly sensitive sensor circuits as well. In particular, in a system employing batteries, there is a demand for ensuring operation at 2.4 V or 1.8 V as the lowest operation voltage. Although the hysteresis comparator circuit 2 serves to prevent malfunction that might occur inherently in circuits such as chattering, in order to permit stable operation at a low voltage, a sufficient hysteresis voltage width with respect to the discrimination level and a limiting circuit 3 for preventing saturation at an input portion are necessary. In addition, in order to reduce costs, it is necessary to configure a circuit having a simple and small circuit configuration that can be realized easily as a semiconductor integrated circuit.

The limiting circuit 3 limits an input voltage Vsig so as not to exceed a limit voltage Vlimit. When an integrating capacitor 5 with a capacitance C is charged with a signal current 4 denoted by Isig, the charging voltage constitutes the input voltage Vsig. The sum of a bias voltage supplied from a bias circuit 7 to the base of a PNP type transistor 6 of the limiting circuit 3 and a pn junction forward voltage between the base and the emitter of the transistor 6 constitutes the limit voltage Vlimit. When the input voltage Vsig exceeds the limit voltage Vlimit, conductivity occurs between the emitter and the collector of the transistor 6, and the impedance becomes low, so that the signal current 4 for charging the integrating capacitor 5 is absorbed to suppress the input voltage Vsig from increasing. The input voltage Vsig that is limited by the limiting circuit 3 is input to a hysteresis comparator 8 in the hysteresis comparator circuit 2 and is compared with a hysteresis threshold voltage Vth.

FIG. 9 shows signal processing waveforms in a principal portion of the comparator circuit 1 of FIG. 8. As shown by the solid lines, even if the input voltage Vsig is changed with variations, when the input voltage exceeds the hysteresis threshold voltage Vth, the output voltage Vout is changed from the high level to the low level. Here, the hysteresis comparator 8 operates in a negative logic in which when an output is off, the level is high, and when it is on, the level is low. With a transition of an output from OFF to ON, the hysteresis threshold voltage Vth is dropped by a hysteresis voltage width Vhis, so that even if the input voltage Vsig is fluctuated, chattering in which small fluctuations of an output occurs.

When the input voltage Vsig is increased and reaches the limit voltage Vlimit, the input voltage is limited by the limiting circuit 3 and does not exceed the limit voltage Vlimit. When the input voltage Vsig is started to drop and reaches the hysteresis threshold voltage Vth that is dropped from the original discrimination level by the hysteresis voltage width Vhis or becomes lower than that, then the output voltage Vout transits from the low level of being an ON state to the high level of being in an OFF state, and the hysteresis threshold voltage Vth is increased by the hysteresis voltage width Vhis. As the output voltage Vout, a pulse output corresponding to an overall change in which small fluctuations of the input voltage Vsig are ignored can be obtained. However, the pulse width in the ON state becomes longer by a period during which the input voltage Vsig is dropped from the limit voltage Vlimit to the hysteresis threshold voltage Vth that has been dropped. When the limiting circuit 3 is not provided, as shown in the broken line, the input voltage Vsig is increased further than the level shown by the limit voltage Vlimit, so that a period of time required for the input voltage to be dropped again becomes longer so that the pulse width is further increased.

A conventional technique related to a comparator with an integrator used for an infrared remote control receiver is disclosed in Japanese Unexamined Patent Publication JP-A 10-187862 (1998) by the present applicant. This conventional technique aims at reducing an influence of the temperature characteristics of a semiconductor on a reference voltage, which serves as the discrimination level, when a comparator circuit with an integrator is realized as a semiconductor integrated circuit.

The comparator circuit 1 shown in FIG. 8 is configured on the assumption that it is implemented in a semiconductor integrated circuit (IC). In semiconductor integrated circuits, various reference voltages such as the hysteresis threshold voltage Vth, the hysteresis voltage width Vhis, the limit voltage Vlimit and the like are generated in internal circuits in many cases. Therefore, the reference voltages are affected significantly by variations in parameters in IC production processes or changes in the ambient temperature during operation.

In the comparator circuit 1 shown in FIG. 8, even if a change occur within the variation range of parameters and within the operation temperature range, it is necessary to satisfy the relationship of the following equation (1).

$$Vlimit > Vth \quad (1)$$

When Vlimit becomes smaller than Vth because of a change in the ambient temperature or the like, the input voltage Vsig exceeds the limit voltage Vlimit before reaching the hysteresis threshold voltage Vth, and is limited by the limiting circuit 3. Therefore, the hysteresis comparator 8 continues to be off, and does not transit to be on, and the output pulse does not normally operate.

In the conventional technique disclosed in JP-A 10-187862, operation in a comparatively wide temperature range is made possible by matching the temperature dependence of the reference voltage corresponding to the limit voltage Vlimit and that of the reference voltage corresponding to the threshold voltage Vth. However, this is not sufficient for 2.4 V or 1.8 V, which has been required for promotion of low voltages in recent years as the lowest operation voltage.

Furthermore, when the limit voltage Vlimit is set sufficiently high or the limiting circuit 3 is not provided, then the ON period of output becomes long and the pulse width becomes wider than necessary. With promotion of low voltages, the hysteresis voltage width Vhis cannot be ensured sufficiently, which causes malfunction such as chattering.

SUMMARY OF THE INVENTION

It is an object of the present invention to provide a comparator circuit in which the pulse width of an output can be controlled easily by operating a limiting circuit appropriately even if the power voltage is low, and an infrared signal receiving apparatus.

The present invention is directed to a comparator circuit comprising a limiting circuit for limiting an input voltage; a hysteresis comparator for performing discrimination of the input voltage, an output being changed so as to be on or off based on a result of the discrimination; and a voltage setting circuit for setting such that a limit voltage serving as a reference for limiting the input voltage by the limiting circuit changes in accordance with an operation of the hysteresis comparator circuit.

According to the invention, the comparator circuit includes a voltage setting circuit to limit an input voltage with a limiting circuit, perform discrimination with a hysteresis comparator and change an output so as to be on or off based on the discrimination result. The voltage setting circuit sets the limit voltage serving as a reference for limiting the input voltage so as to change in accordance with an operation of the hysteresis comparator circuit. Since the limit voltage changes in accordance with the operation of the hysteresis, comparator circuit, the relationship with the discrimination level of the hysteresis comparator circuit can be adjusted in accordance with the operation, so that the hysteresis comparator circuit can be operated appropriately even in a low voltage operation. The pulse width of an output can be controlled by adjusting the limit voltage of the limiting circuit.

According to the invention, the limit voltage of the limiting circuit changes in accordance with the operation of the hysteresis comparator circuit, the hysteresis comparator circuit can be operated appropriately even in a low voltage operation. The pulse width of an output can be controlled by adjusting the limit voltage of the limiting circuit.

In the invention, it is preferable that the voltage setting circuit sets the limit voltage to be high when the output is off, and to be low when the output is on.

According to the invention, since the voltage setting circuit sets the limit voltage to be high when the output of the hysteresis comparator circuit is off and the discrimination level is higher by the width of a hysteresis voltage, a normal operation of the hysteresis comparator circuit can be ensured. When the output of the hysteresis comparator circuit is on and the discrimination level is lower by the width of a hysteresis voltage, the voltage setting circuit sets the limit voltage to be low, so that the output pulse width can be controlled appropriately so as not to be too wide.

According to the invention, since the limit voltage is set high when the hysteresis comparator circuit is off, a normal operation of the hysteresis comparator circuit can be ensured. Since the limit voltage is set low when the hysteresis comparator circuit is on, the output pulse width can be controlled appropriately so as not to be too wide.

In the present invention, it is preferable that the voltage setting circuit sets the limit voltage in response to a discrimination level that changes in accordance with hysteresis in the hysteresis comparator circuit.

According to the invention, the limit voltage is changed in response to the discrimination level of the hysteresis comparator circuit, so that the limit voltage also can be provided easily with the hysteresis characteristics similar to those of the discrimination level.

According to the invention, the limit voltage of the limiting circuit can be provided easily with the hysteresis characteristics similar to those of the discrimination level of the hysteresis comparator circuit.

In the present invention, it is preferable that the limiting circuit includes:

an upper limiter for limiting the input voltage in a range of voltages that are higher than the discrimination level; and a lower limiter for limiting the input voltage in a range of voltages that are lower than the discrimination level.

According to the invention, since the limiting circuit include an upper limiter for limiting the input voltage in a range of voltages that are higher than the discrimination level, and a lower limiter for limiting the input voltage in a range of voltages that are lower than the discrimination level, the output pulse width can be controlled more appropriately.

According to the invention, since the limiting circuit includes the upper limiter and the lower limiter, the output pulse width can be controlled more appropriately.

In the invention, it is preferable that the voltage setting circuit includes a buffer for inputting an operation of the hysteresis comparator circuit.

According to the invention, the operation of the hysteresis comparator circuit can be reflected on the limit voltage via the buffer, so that the operation of the limiting circuit does not affect the hysteresis comparator circuit.

Furthermore, according to the present invention, the buffer makes it possible that the operation of the limiting circuit does not affect the hysteresis comparator circuit.

In the invention, it is preferable that the voltage setting circuit sets the limit voltage such that the limit voltage is provided with temperature change characteristics of the hysteresis comparator circuit to match the voltage setting circuit to the temperature change characteristics.

According to the invention, even if the operation characteristics of the hysteresis comparator circuit are affected by the temperature and are varied, the temperature range in which the hysteresis comparator circuit operates normally can be widened because the limit voltage of the limiting circuit is similarly affected and varied by the temperature.

According to the invention, the temperature range in which the hysteresis comparator circuit operates normally can be widened.

Furthermore, the invention is directed to an infrared signal receiving apparatus comprising:

the comparator circuit as described above;

an infrared receiving circuit for receiving an infrared signal and generating an electric signal corresponding to the infrared signal;

a signal extracting circuit for selectively extracting a signal suited for a predetermined condition from electrical signals from the infrared receiving circuit; and an integrating circuit for performing integration processing with respect to a signal extracted by signal extracting means and supplying an integrated output as an input voltage to the comparator circuit.

According to the invention, the infrared signal receiving apparatus includes an infrared receiving circuit, a signal extracting circuit and an integrating circuit as well as the comparator circuit as described above. Even in a low voltage operation, using the comparator circuit in which the pulse width of an output can be adjusted as appropriate, it can be determined appropriately whether or not a carrier is included in an output obtained after an integrating circuit integrates a signal extracted selectively as being suited for a predetermined condition by the signal extracting circuit from electrical signals generated after the infrared receiving circuit receives an infrared signal.

Furthermore, according to the invention, even in a low voltage operation, it can be determined appropriately whether or not a carrier is included in an infrared signal with the comparator circuit in which the pulse width of an output can be adjusted as appropriate.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
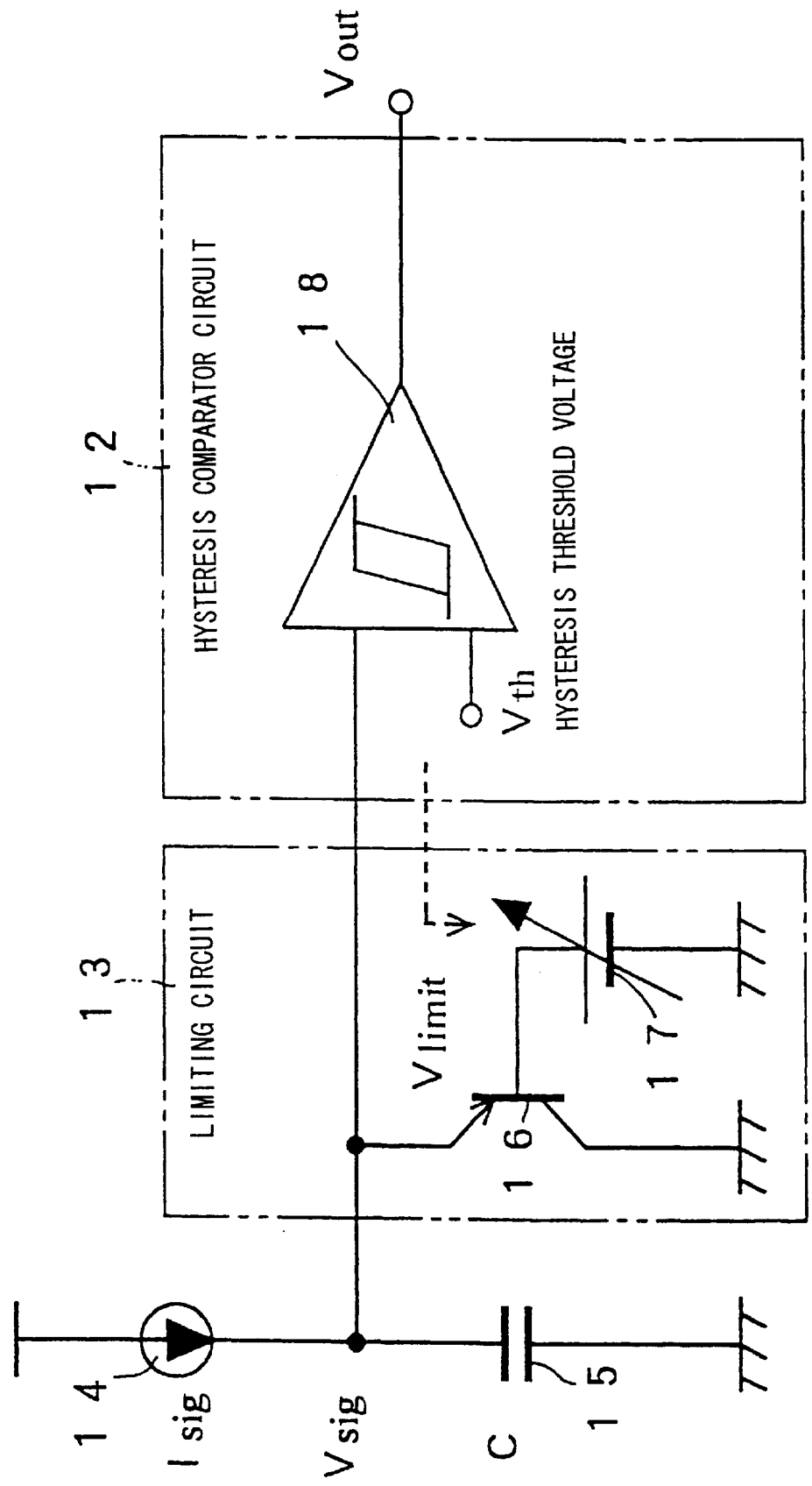
FIG. 1 is a block diagram showing a schematic electrical configuration of a comparator circuit, which is one embodiment of the present invention.

Now referring to the drawings, preferred embodiments of the invention are described below.

FIG. 1 is a block diagram showing a schematic electrical configuration of a comparator circuit 11, which is one embodiment of the present invention. The comparator circuit 11 of this embodiment aims at preventing saturation at an input portion by limiting an input voltage to a hysteresis comparator circuit 12 with a limiting circuit 13. The input voltage Vsig input to the limiting circuit 13 is a terminal voltage at which an integrating capacitor 15 having a capacitance C is charged with a signal current Isig from an infrared receiving device, a highly sensitive sensor 14 or the like. The limiting circuit 13 for limiting this input voltage Vsig includes a PNP-type transistor 16 and a bias circuit 17. The hysteresis comparator circuit 12 includes a hysteresis comparator 18 having the hysteresis characteristics. The bias circuit 17 of this embodiment, which serves as voltage setting means, can set a limit voltage Vlimit so as to change in accordance with the operation of the hysteresis comparator 18.

Figure 8:
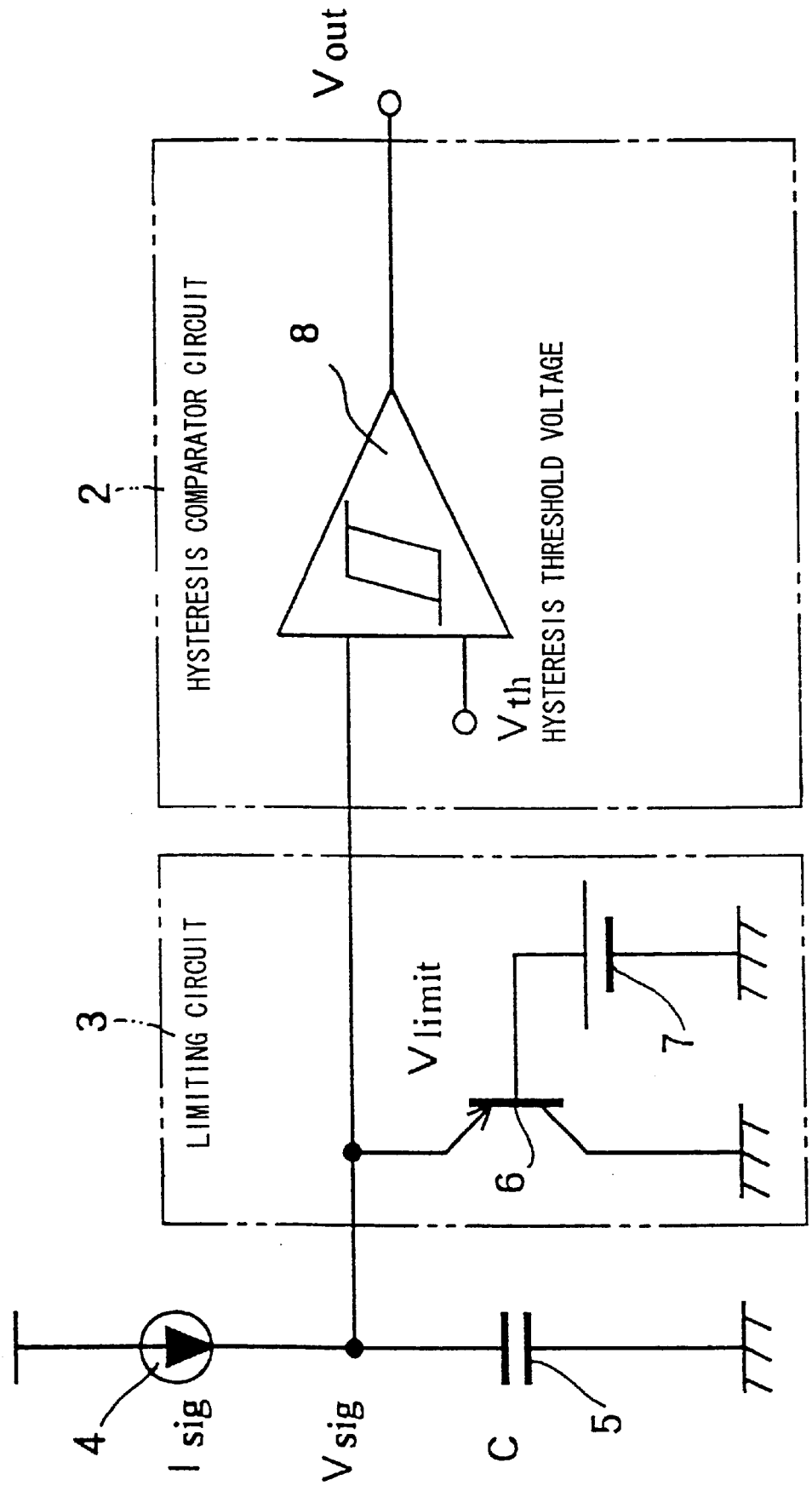
FIG. 8 is a block diagram showing a schematic electrical configuration of a conventional comparator circuit.

The limiting circuit 13 limits the input voltage Vsig so as not to exceed the limit voltage Vlimit in the same manner as the limiting circuit 3 of FIG. 8. The sum of a bias voltage supplied from the bias circuit 17 to the base of the PNP type transistor 16 of the limiting circuit 13 and a pn junction forward voltage between the base and the emitter of the transistor 16 constitutes the limit voltage Vlimit. When the input voltage Vsig exceeds the limit voltage Vlimit, a portion between the emitter and the collector of the transistor 16 is turned on, and the impedance becomes low, so that the signal current 14 for charging the integrating capacitor 15 is absorbed to suppress the input voltage Vsig from increasing. The input voltage Vsig that is limited by the limiting circuit 13 is input to the hysteresis comparator 18 in the hysteresis comparator circuit 12 and is compared with a hysteresis threshold voltage Vth. These operations are the same as those of the limiting circuit 3 of FIG. 8.

However, in the limiting circuit 13 of this embodiment, the bias circuit 17 sets the limit voltage Vlimit, which is the reference for limiting the input voltage Vsig, so as to change in accordance with the operation of the hysteresis comparator 18. Since the limit voltage Vlimit changes in accordance with the operation of the hysteresis comparator circuit 12, the relationship with the hysteresis threshold voltage Vth, which is the discrimination of the hysteresis comparator circuit 12, is adjusted in accordance with the operation, and the hysteresis comparator circuit 12 can be operated as appropriate even in a low voltage operation, and the pulse width of an output can be controlled by adjusting the limit voltage Vlimit of the limiting circuit 13.

Figure 2:
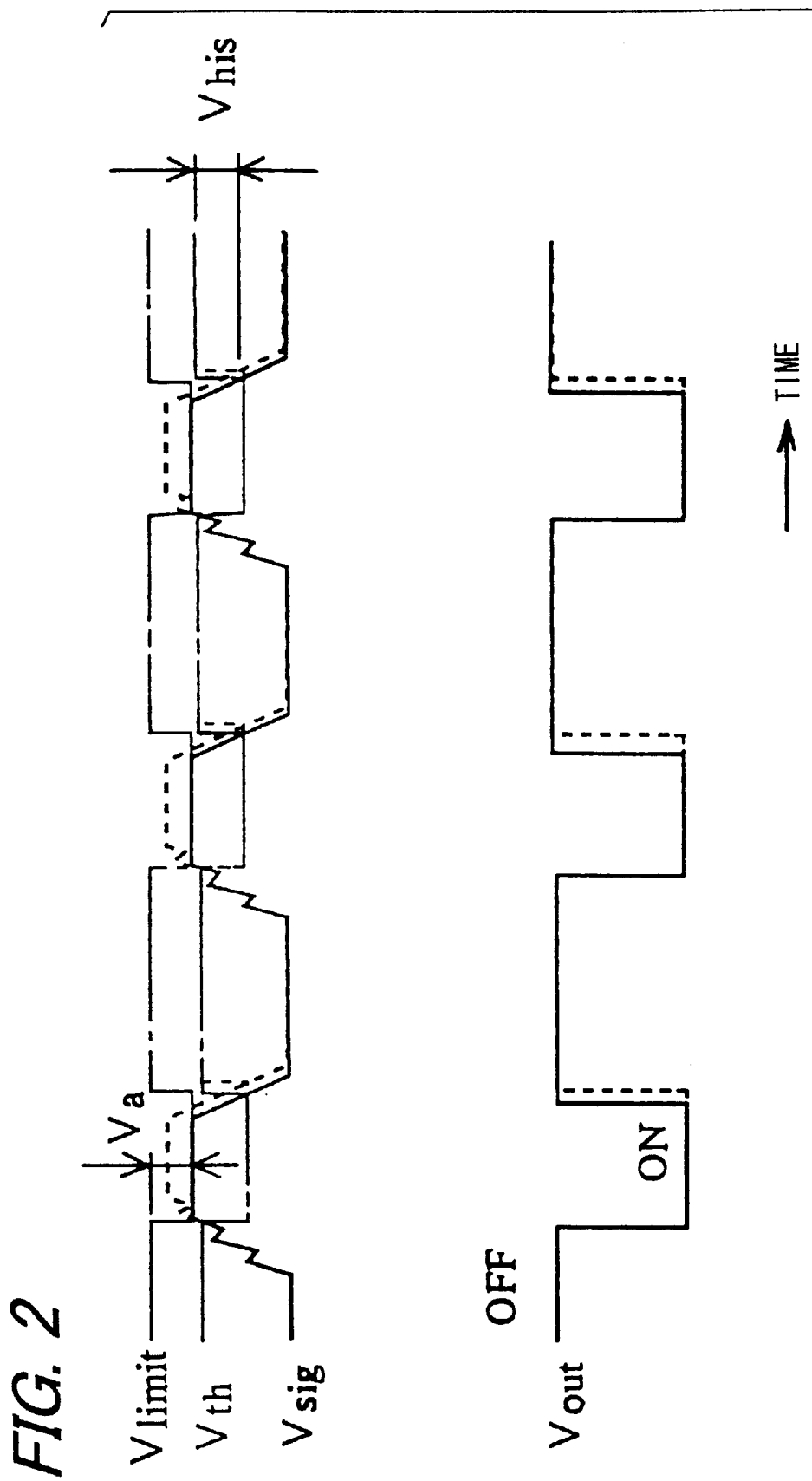
FIG. 2 is a diagram showing operation waveforms of a principal portion of FIG. 1.
Figure 9:
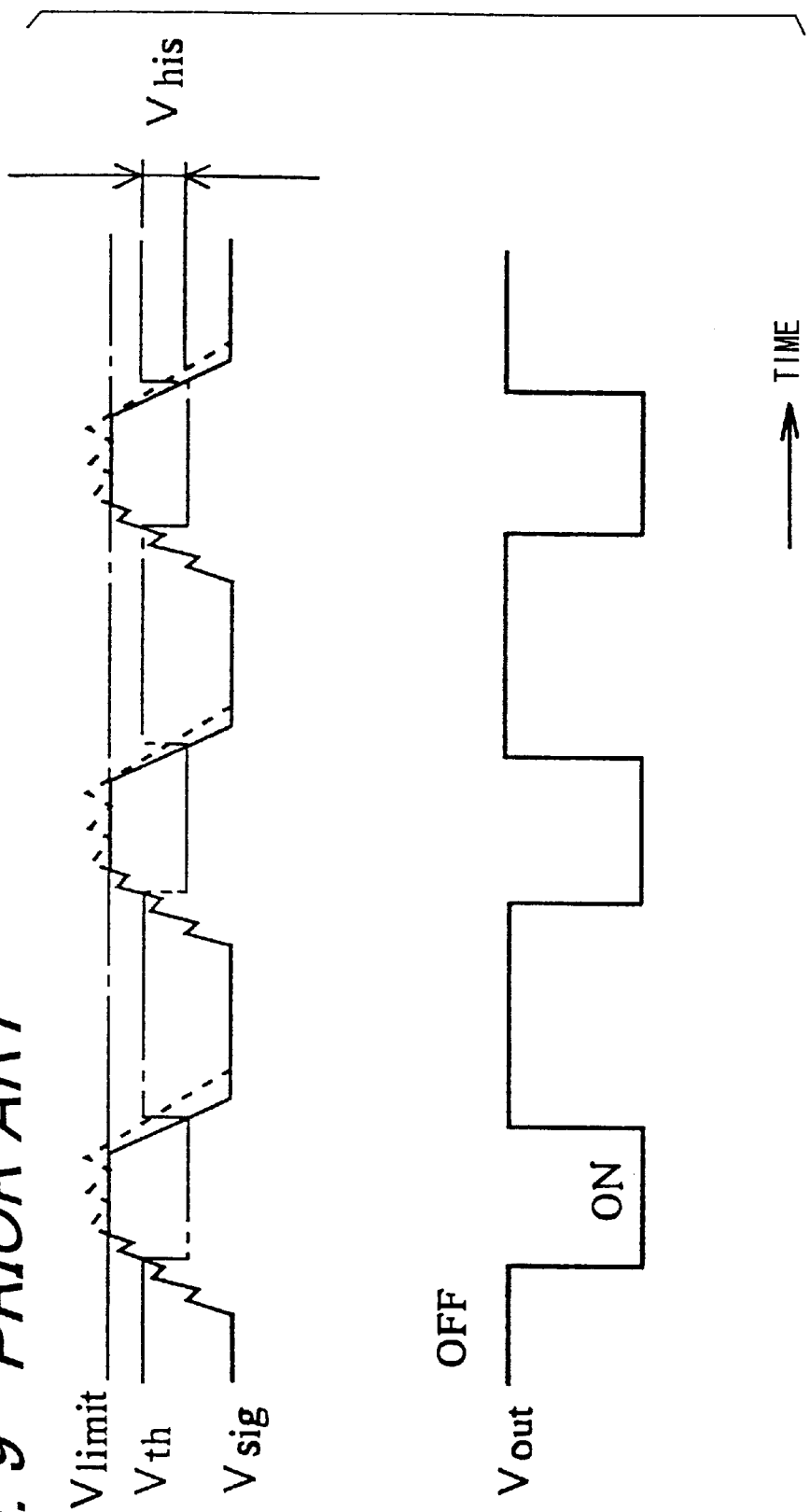
FIG. 9 is a diagram showing operation waveforms of a principal portion of FIG. 8.

FIG. 2 is a diagram showing signal processing waveforms of a principal portion of the comparator circuit 11 of FIG. 1. Similarly to FIG. 9, as shown by the solid lines, even if the input voltage Vsig is changed with variations, when the input voltage exceeds the hysteresis threshold voltage Vth, the output voltage Vout is changed from the high level to the low level. Here, the hysteresis comparator 18 operates in a negative logic in which when an output is off, the level is high, and when it is on, the level is low. With a transition of an output from OFF to ON, the hysteresis threshold voltage Vth is dropped by a hysteresis voltage width Vhis. In this embodiment, the limit voltage Vlimit is also dropped by a variation width Va, corresponding to the drop of the hysteresis threshold voltage Vth.

When the input voltage Vsig is increased and reaches the limit voltage Vlimit, which is dropped by the variation width Va, the input voltage is limited by the limiting circuit 13 and does not exceed the limit voltage Vlimit. When the input voltage Vsig is started to drop and reaches the hysteresis threshold voltage Vth that is dropped from the original discrimination level by the hysteresis voltage width Vhis or becomes lower than that, then the output voltage Vout transits from the low level of being an ON state to the high level of being in an OFF state, and the hysteresis threshold voltage Vth is increased by the hysteresis voltage width Vhis. In this case, the pulse width can be limited, as opposed to the case where the ON state becomes longer as shown in broken lines when the limit voltage Vlimit stays as it is and is not changed.

As described above, the limiting circuit 13 is required to operate during a period after the integrating capacitor 15 is charged and the input voltage Vsig exceeds the hysteresis threshold voltage Vth, that is, a period during which the output from the comparator circuit 11 is on. The limiting circuit 13 does not operate while the output is off. The hysteresis threshold voltage Vth is dropped by the hysteresis voltage width Vhis while the output is on, and is set low. Therefore, the limit voltage Vlimit is accordingly changed so as to be low while the output is on and be high while output is off, so that the allowable range of the relationship of the equation (1) described above can be larger. The variation width of the limit voltage Vlimit is Va, and the circuit operates stably by satisfying the following equation (2), and the voltage can be made even lower by Va than in the case of equation 1.

$$Vlimit + Va > Vth \qquad (2)$$

Figure 3:
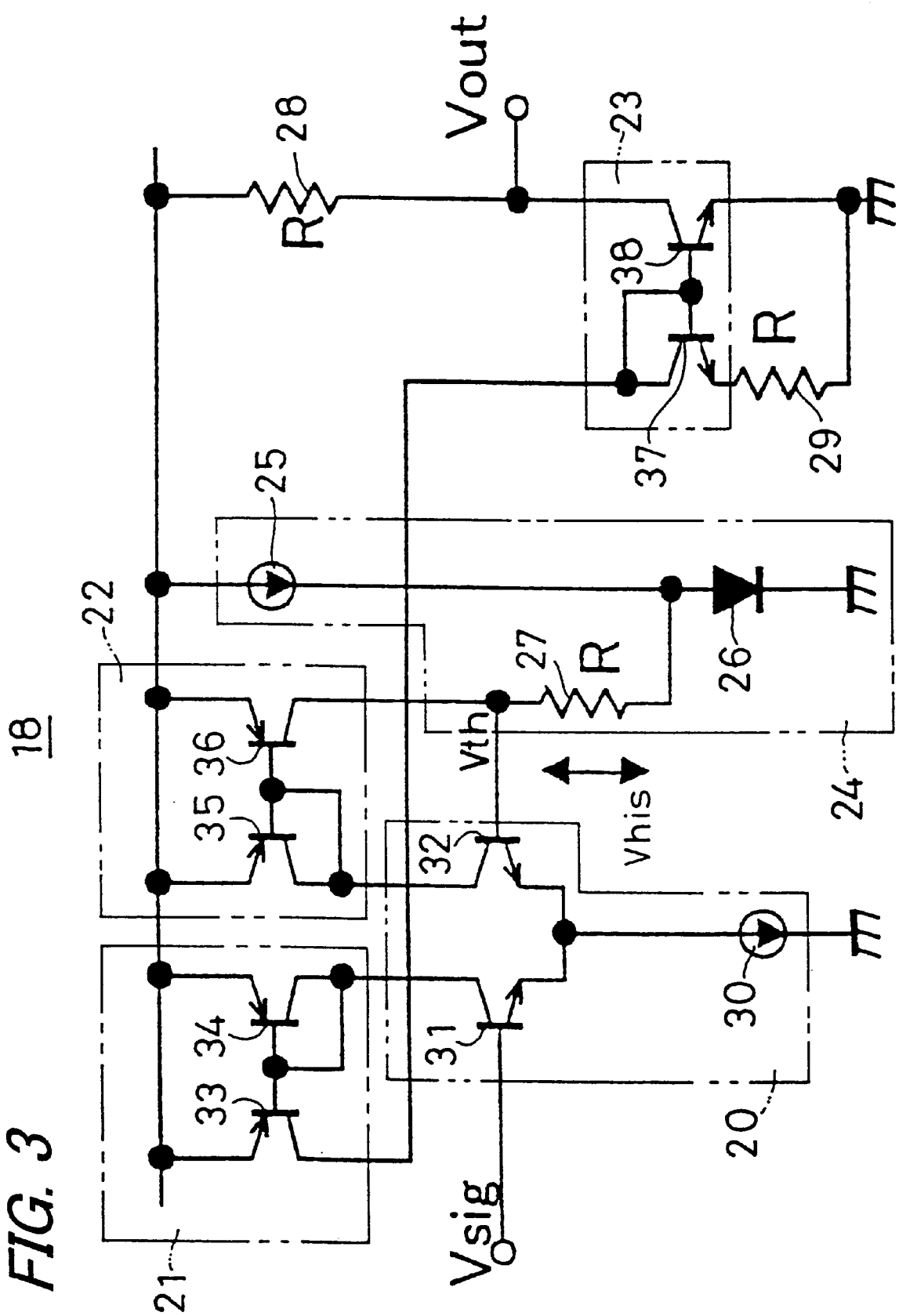
FIG. 3 is an equivalent circuit diagram of a hysteresis comparator of FIG. 1.

FIG. 3 shows an example of an equivalent circuit when the hysteresis comparator 18 of FIG. 1 is devised as an IC. The hysteresis comparator 18 includes a comparing circuit 20, current mirror circuits 21, 22, and 23 and a hysteresis circuit 24. The hysteresis 24 comprises a constant current circuit 25 of which an input terminal is electrically connected to a positive voltage source, a diode 26 which is electrically connected to the constant current circuit 25, and a resistor 27 which is interposed between an output terminal of the second current mirror circuit 22 and an output terminal of the constant current circuit 25. The anode of the diode 26 is electrically connected to the output terminal of the constant current circuit 25 and the cathode of the diode 26 is grounded. The hysteresis circuit 24 can switch the hysteresis threshold voltage Vth between the voltage generated as a pn-junction forward voltage of a diode 26 by a current supplied from a constant current circuit 25 and the voltage obtained by superimposing a voltage corresponding to the voltage variation Vhis generated at both terminals of a resistor 27 thereon. The output Vout from the hysteresis comparator 18 is retrieved as an output from the third current mirror circuit 23 via a resistor 28 that is pulled up by a positive power voltage. The third current mirror circuit 23 includes a resistor 29 for amplifying an output current.

The comparing circuit 20 includes a pair of NPN-type transistors 31 and 32 whose emitters are connected commonly to an input terminal of a constant current circuit 30. An output terminal of the constant current circuit 30 is grounded. The input voltage Vsig is supplied to the base of one transistor 31, and the hysteresis threshold voltage Vth from the hysteresis circuit 24 is supplied to the base of the other transistor 32. Current is supplied to the collectors of the transistors 31 and 32 from the first and second current mirror circuits 21 and 22, respectively. The first and second current mirror circuits 21 and 22 each include a pair of PNP type-transistors 33 and 34, and 35 and 36, respectively. A change in the collector current of the transistor 31 is transmitted to the third current mirror circuit 23 via the first current mirror circuit 21. The third current mirror circuit 23 includes a pair of NPN-type transistors 37 and 38.

More specifically, in the first current mirror circuit 21 the bases of the transistors 33, 34 are electrically connected to each other, and the collector of the transistor 34 is electrically connected in common to the electrically connected bases of the transistors 33, 34. The emitters of the transistors 33, 34 are electrically connected to the positive voltage source. The collector of the transistor 34 is electrically connected to the collector of the transistor 31 in the comparing circuit 20, and the collector of the transistor 33 is electrically connected to the collector of the transistor 37 in the third current mirror circuit 23.

In the second current mirror circuit 22, the bases of the transistors 35, 36 are electrically connected to each other, and the collector of the transistor 35 is electrically connected in common to the electrically connected bases of the transistors 35, 36. The emitters of the transistors 35, 36 are electrically connected to the positive voltage source. The collector of the transistor 35 is electrically connected to the collector of the transistor 32 in the comparing circuit 20, and the collector of the transistor 36 is electrically connected to the resistor 27 in the hysteresis circuit 24.

In the third current mirror circuit 23, the bases of the transistors 37, 38 are electrically connected to each other, and the collector of the transistor 37 is electrically connected in common to the electrically connected bases of the transistors 37, 38. The emitter of the transistor 37 is electrically connected to one terminal of the resistor 29. The collector of the transistor 38 is electrically connected to the positive voltage source via the resistor 28. The emitter of the transistor 38 and the other terminal of the resistor 29 are grounded.

The comparing circuit 20 operates such that either one of the pair of transistors 31 and 32 is on and the other is off. When the transistor 31 is turned off, the current mirror circuits 21 and 23 are turned off, and in the resistor 28, a voltage drop does not occur. Therefore, the output voltage Vout is turned to the high level. The current mirror circuit 22 is turned on, so that in the resistor 27, a voltage drop occurs, and the hysteresis threshold voltage Vth is higher than the forward voltage of the diode 26 by a voltage corresponding to the voltage drop. When the transistor 31 is turned on, the current mirror circuits 21 and 23 are also on, and in the resistor 28, a voltage drop occurs and the output voltage Vout is turned to the low level. The current mirror circuit 22 is turned off, so that in the resistor 27, a voltage drop does not occur any more, and the hysteresis threshold voltage Vth becomes equal to the forward voltage of the diode 26 and is dropped.

Figure 4:
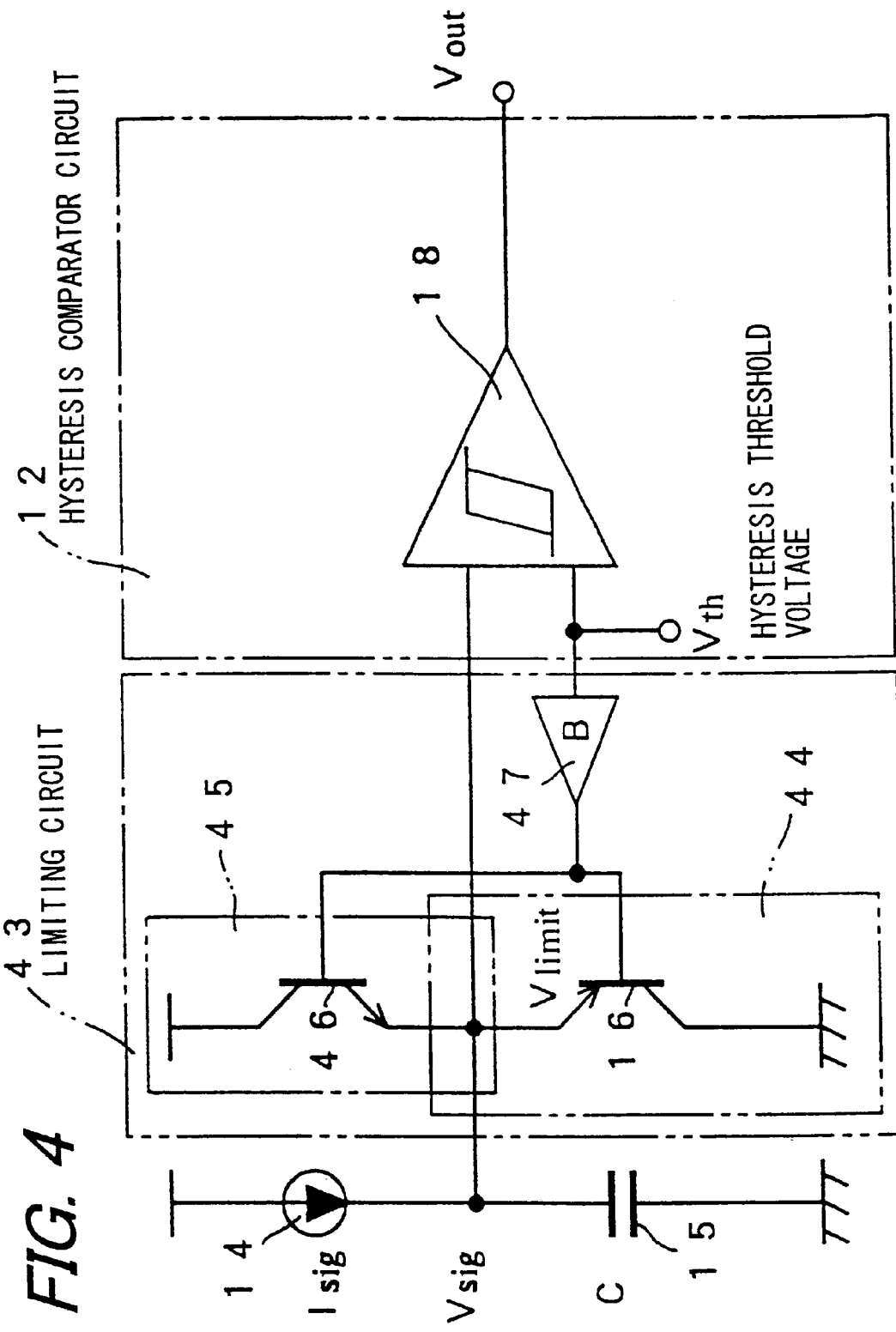
FIG. 4 is a block diagram showing a schematic electrical configuration of a comparator circuit, which is another embodiment of the present invention.

FIG. 4 is a block diagram showing a schematic electrical configuration of a comparator circuit 41, which is another embodiment of the present invention. In this embodiment, the elements corresponding to those in the embodiment of FIG. 1 bear the same reference numerals, and duplicate description is omitted. The comparator 41 of this embodiment includes an upper limiter 44, a lower limiter 45, an NPN-type transistor 46 and a buffer circuit 47 as a limiting circuit 43. The upper limiter 44 has a configuration equal to that of the limiting circuit 13 of FIG. 1. The limiting circuit 43 not only has a function of preventing saturation at the input portion of the hysteresis comparator 18, as the limiting circuit 13 has, but also is configured such that the bases of the transistors 16 and 46 of the upper limiter 44 and the lower limiter 45 are supplied commonly with the hysteresis threshold voltage Vth of the hysteresis comparator 18 from a buffer circuit 47 including a buffer, which serves as a voltage setting circuit.

The active region of the limiting circuit 43 is the same as the limiting circuit 13 of FIG. 1, but in the upper limiter 44, by setting the limit voltage Vlimit higher than the hysteresis threshold voltage Vth by a voltage corresponding to the forward voltage Vbe at the pn-junction between the base and the emitter of the transistor 16, the limit voltage Vlimit can be set to be low when the output is on and to be high when the output is off with a simple circuit. The following equation (3) shows the limit voltage Vlimit when the output is on, and equation 4 shows the limit voltage Vlimit when the output is off.

$$Vlimit = Vth + Vbe - Vhis \text{ (when the output is on)} \quad (3)$$

$$Vlimit = Vth + Vbe \text{ (when the output is off)} \quad (4)$$

Furthermore, Equations (3) and (4) indicate that the temperature dependence of the limit voltage Vlimit and the hysteresis threshold voltage Vth is $-2$ mV/° C. per 1 volt of Vbe at the maximum, and it is easy to match the temperature dependence by the technique disclosed in JP-A 10-187862.

Furthermore, since the lower limiter 45 is provided, it is possible to set the limit voltage Vlimit (Lo) on the side of lower voltage to be low when the output is on and be high when the output is off. In other words, the following equation (5) shows the limit voltage Vlimit when the output is on, and equation (6) shows the limit voltage Vlimit (Lo) when the output is off.

$$Vlimit\ (Lo) = Vth - Vbe - Vhis \text{ (when the output is on)} \quad (5)$$

$$Vlimit\ (Lo) = Vth - Vbe \text{ (when the output is off)} \quad (6)$$

In this embodiment, a time t1 until when the output is turned on is expressed by the following equation (7), so that the pulse can be kept stable and a detectable pulse width can be stable.

$$t1 = C \times Vbe / Isig \quad (7)$$

Furthermore, the buffer circuit 47 is provided between the upper limiter 44 and the lower limiter 45 and the hysteresis circuit 24 of FIG. 3 that generates the hysteresis threshold voltage Vth in the hysteresis comparator 18, so that an influence of a charging current flowing into the hysteresis circuit 24 or the like can be reduced during operation of the limiting circuit 43. Without the buffer circuit 47, a current of $1/\beta$ of the charging current Isig, where $\beta$ is the current amplification factor of the transistors 16 and 46, flows into the hysteresis comparator 18, for example, into the hysteresis circuit 24. Such a buffer circuit 47 also can be used in the limiting circuit 13 of FIG. 1.

Figure 5:
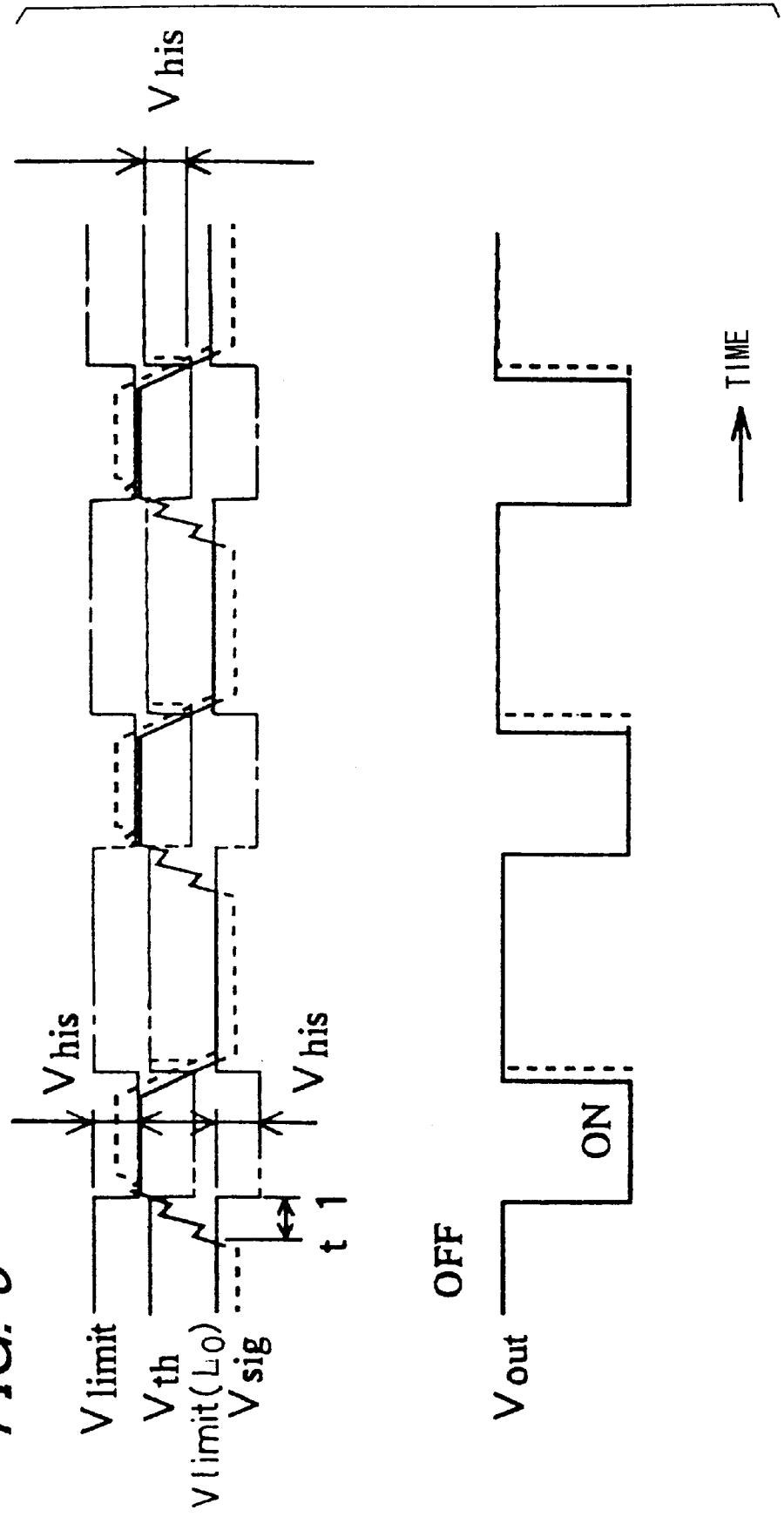
FIG. 5 is a diagram showing operation waveforms of a principal portion of FIG. 4.

FIG. 5 shows signal processing waveforms of a principal portion of the comparator circuit 41 of FIG. 4. The operation of the hysteresis comparator circuit 12 is performed in the same manner as in FIG. 2. The operation of the upper limiter 44 is also performed in the same manner as that of the limiting circuit 13 in FIG. 1. In this embodiment, the limit voltage Vlimit (Lo) on the lower side by the lower limiter 45 is also changed in response to the hysteresis threshold voltage Vth.

Figure 6:
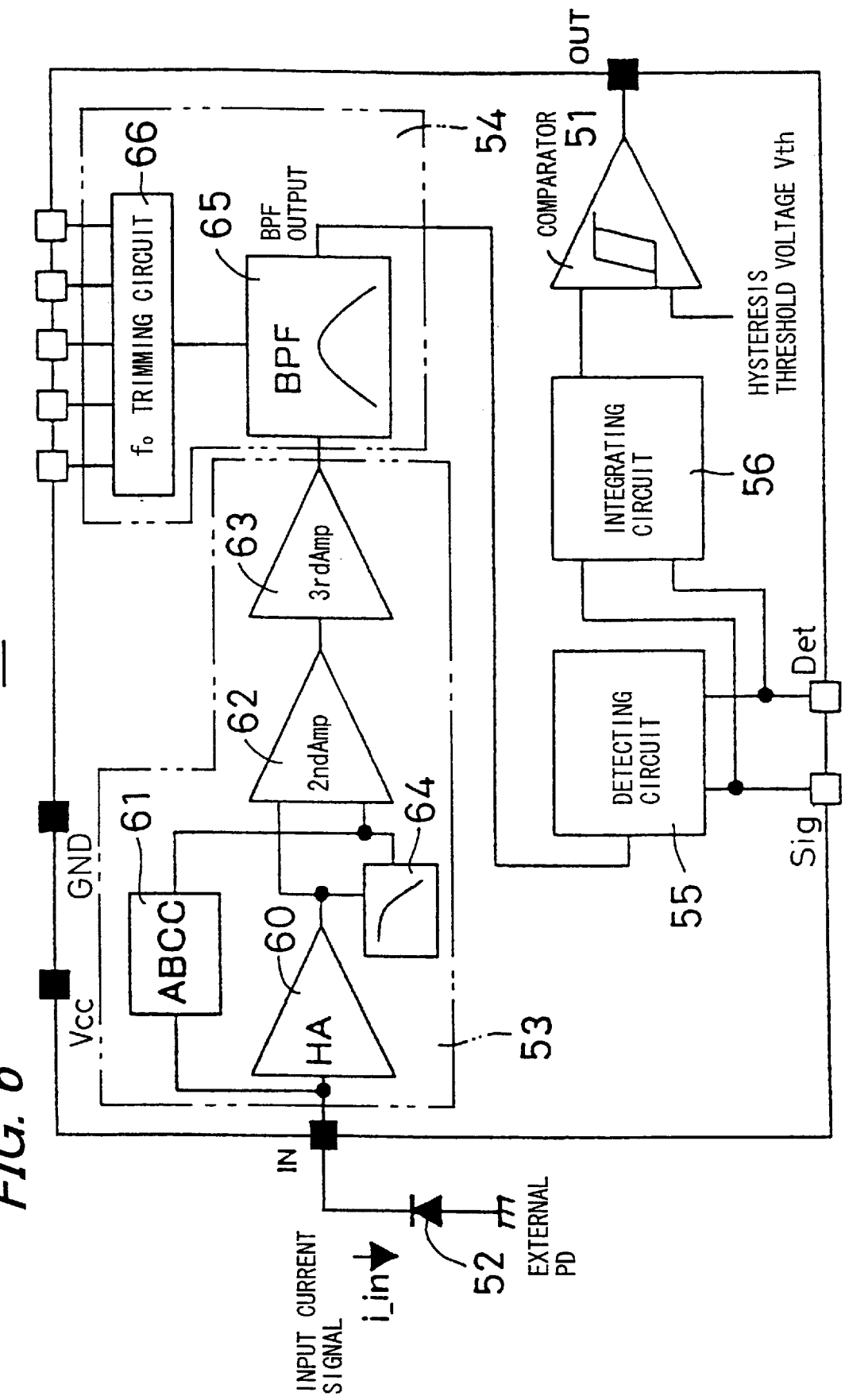
FIG. 6 is a block diagram showing a schematic electrical configuration of an infrared remote control receiver, which is another embodiment of the present invention.

FIG. 6 shows a schematic electrical configuration of an infrared remote control receiver 50 employing the comparator circuit 11 of the embodiment of FIG. 1 or the comparator circuit 41 of the embodiment of FIG. 4 as an infrared signal receiving apparatus, which is still another embodiment of the present invention. The infrared remote control receiver 50 employs the comparator circuit 11 or 41 as a comparator circuit 51. The comparator circuit 51 amplifies an output from an infrared receiving circuit including a photodiode 52 at an amplifying circuit 53, and selects a carrier at a selecting circuit 54 as a signal extracting circuit, detects the carrier at a detecting circuit 55, discriminates a voltage integrated at an integrating circuit 56 so that it is determined whether or not the carrier is present. The amplifying circuit 53 includes a head amplifier 60, an ABCC (auto bias current control) circuit 61, a second amplifier 62, a third amplifier 63, and a low pass filter 64. The selecting circuit 54 includes a bandpass filter 65 and a f0 trimming circuit 66. An output from the comparator circuit 51 is supplied to a microcomputer or the like that controls electronic equipment.

The output terminal of the infrared receiving circuit is electrically connected to an input terminal IN of the infrared remote control receiver 50. In the amplifying circuit 53, an input terminal of the head amplifier 60 is electrically connected to the input terminal IN of the infrared remote control receiver 50. An output terminal of the head amplifier is electrically connected to one input terminal of the second amplifier 62 and as well is electrically connected to an input terminal of the low pass filter 64. An output terminal of the low pass filter 64 is electrically connected to the other input terminal of the second amplifier 62. Terminals of the ABCC circuit 61 are electrically connected between the output terminal of the low pass filter 64 and the input terminal of the head amplifier 60. The output terminal of the second amplifier 62 is electrically connected to an input terminal of the third amplifier 63.

In the selecting circuit 54, an output terminal of the third amplifier 63 is electrically connected to the bandpass filter 65. The bandpass filter 65 is electrically connected to the f0 trimming circuit 66 and as well is electrically connected to the detecting circuit 55.

In the detecting circuit 55, one terminal for a signal Sig thereof is electrically connected to one input terminal of the integrating circuit 56 and the other terminal for a signal Det thereof is electrically connected to the other input terminal of the integrating circuit 56. An output terminal of the integrating circuit 56 is electrically connected to an input terminal of the comparator circuit 51. An output terminal of the comparator circuit 51 is electrically connected to an output terminal OUT of the infrared remote control receiver 50.

In the infrared remote control receiver 50, a photodiode 52 constituting an infrared receiving circuit receives an infrared signal. An optical signal current output from the photodiode 52 is an ASK signal that is modulated with a carrier defined by a frequency band of about 30 kHz to 60 kHz. In a signal-receiving chip such as the amplifying circuit 53, an input optical signal current i_in is amplified by three amplifiers 60, 62 and 63, a carrier component is retrieved by the bandpass filter 65 that is tuned to the frequency of the carrier, and the carrier is detected at the detecting circuit 55. Then, in the integrating circuit 56, a time of the carrier is integrated, so that a digital output indicating whether or not the carrier is present is given out.

In the low pass filter 64, a direct current level due to fluorescent light and/or sunlight is detected. In the second amplifier 62, a signal obtained by removing the direct current level detected by the low pass filter 64 from the direct output of the head amplifier 60 is amplified. Thereby adverse effects of the fluorescent light and/or sunlight are reduced to a certain degree. In the ABCC circuit 61, in response to the output of the low pass filter 64, the direct current bias of the head amplifier 60 is controlled.

Figure 7:
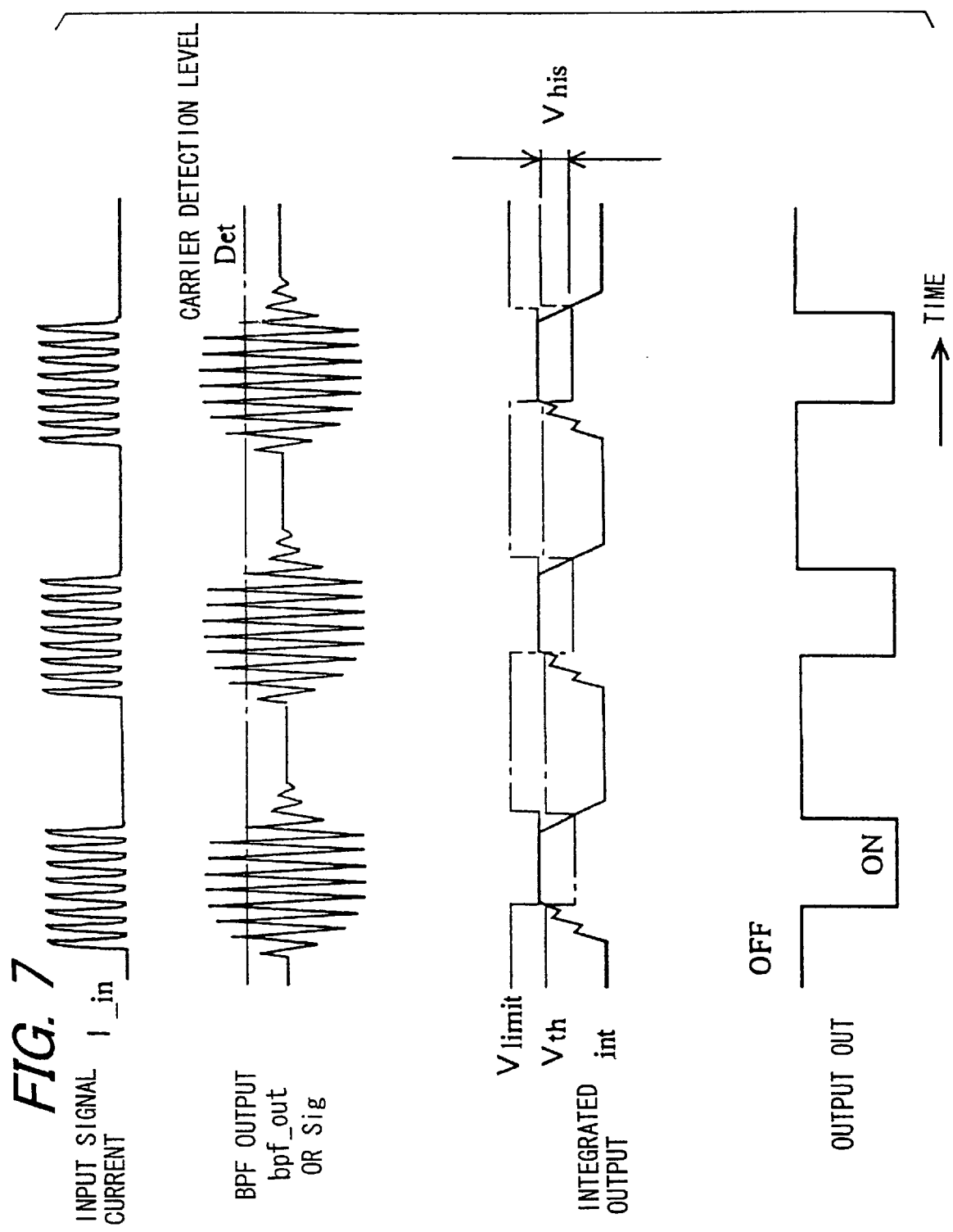
FIG. 7 is a diagram showing operation waveforms of a principal portion of FIG. 6.

FIG. 7 shows signal processing waveforms of a principal portion of the infrared remote control receiver 50 of FIG. 6. A signal obtained by detecting an output from the bandpass filter 65 for extracting a carrier and integrating the output is input to the comparator circuit 51 as the input voltage Vsig, and is compared with the hysteresis threshold voltage Vth, and a comparison result is output. As described above, the comparator circuit 51 includes the limiting circuits 13 and 43 for prevention of saturation at the input portion, and the output pulse width is controlled so as not to be too large.

The comparators 11 and 41 shown in FIGS. 1 and 4, respectively, can be used effectively in not only an infrared signal receiving apparatus, but also a portion where a hysteresis comparator is used, such as the input portion of a highly sensitive sensor.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A comparator circuit comprising:
    a limiting circuit for limiting an input voltage;
    a hysteresis comparator for performing discrimination of the input voltage, an output being changed so as to be on or off based on a result of the discrimination; and
    a voltage setting circuit for setting such that a limit voltage serving as a reference for limiting the input voltage by the limiting circuit changes in accordance with an operation of the hysteresis comparator circuit.

2. The comparator circuit of claim 1, wherein the voltage setting circuit sets the limit voltage to be high when the output is off, and to be low when the output is on.

3. The comparator circuit of claim 1, wherein the voltage setting circuit sets the limit voltage in response to a discrimination level that changes in accordance with hysteresis in the hysteresis comparator circuit.

4. The comparator circuit of claim 2, wherein the voltage setting circuit sets the limit voltage in response to a discrimination level that changes in accordance with hysteresis in the hysteresis comparator circuit.

5. The comparator circuit of claim 1, wherein the limiting circuit includes:
    an upper limiter for limiting the input voltage in a range of voltages that are higher than the discrimination level; and
    a lower limiter for limiting the input voltage in a range of voltages that are lower than the discrimination level.

6. The comparator circuit of claim 1, wherein the voltage setting circuit includes a buffer for inputting an operation of the hysteresis comparator circuit.

7. The comparator circuit of claim 1, wherein the voltage setting circuit sets the limit voltage such that the limit voltage is provided with temperature change characteristics of the hysteresis comparator circuit to match the voltage setting circuit to the temperature change characteristics.

8. An infrared signal receiving apparatus comprising:
    the comparator circuit of claim 1;
    an infrared receiving circuit for receiving an infrared signal and generating an electric signal corresponding to the infrared signal;
    a signal extracting circuit for selectively extracting a signal suited for a predetermined condition from electrical signals from the infrared receiving circuit; and
    an integrating circuit for performing integration processing with respect to a signal extracted by signal extracting means and supplying an integrated output as an input voltage to the comparator circuit.

* * * * *